(12) United States Patent
McConnelee et al.

(10) Patent No.: US 9,847,236 B2
(45) Date of Patent: Dec. 19, 2017

(54) ELECTRICAL INTERCONNECT STRUCTURE FOR AN EMBEDDED ELECTRONICS PACKAGE

(71) Applicant: General Electric Company, Schenectady, NY (US)

(72) Inventors: Paul Alan McConnelee, Albany, NY (US); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/594,794

(22) Filed: May 15, 2017

(65) Prior Publication Data

US 2017/0250093 A1    Aug. 31, 2017

Related U.S. Application Data

(63) Continuation of application No. 14/464,877, filed on Aug. 21, 2014, now Pat. No. 9,653,438.

(51) Int. Cl.
| | | |
|---|---|---|
| *H01L 29/80* | (2006.01) | |
| *H01L 31/112* | (2006.01) | |
| *H01L 21/56* | (2006.01) | |
| *H01L 23/31* | (2006.01) | |
| *H01L 23/538* | (2006.01) | |
| *H01L 23/00* | (2006.01) | |
| *H01L 21/48* | (2006.01) | |

(Continued)

(52) U.S. Cl.
CPC .......... *H01L 21/561* (2013.01); *H01L 21/486* (2013.01); *H01L 23/147* (2013.01); *H01L 23/3114* (2013.01); *H01L 23/3128* (2013.01); *H01L 23/49827* (2013.01); *H01L 23/538* (2013.01); *H01L 24/19* (2013.01)

(58) Field of Classification Search
CPC ............... H01L 21/561; H01L 23/5389; H01L 23/49827; H01L 25/16
USPC ......................................................... 257/774
See application file for complete search history.

(56) References Cited

U.S. PATENT DOCUMENTS

| | | |
|---|---|---|
| 5,701,034 A | 12/1997 | Marrs |
| 6,489,185 B1 | 12/2002 | Towle et al. |
| 6,713,859 B1 | 3/2004 | Ma |

(Continued)

FOREIGN PATENT DOCUMENTS

WO        2011090568 A2    7/2011

OTHER PUBLICATIONS

European Search Report and Written Opinion issued in connection with EP Application No. 15181542.0-1552 dated Mar. 29, 2016.

*Primary Examiner* — David S Blum
(74) *Attorney, Agent, or Firm* — Ziolkowski Patent Solutions Group, SC

(57) ABSTRACT

An electronics package includes a lower insulating layer, an upper insulating layer coupled to the lower insulating layer, and a conductive contact pad coupled to a second surface of the upper insulating layer. An electrical component is positioned within an opening formed through the upper insulating layer. A first interconnect layer extends through at least one via in the lower insulating layer to electrically couple with at least one contact pad on the electrical component and a second interconnect layer extends through at least one via in the upper insulating layer and electrically couples the first interconnect layer to the conductive contact pad.

23 Claims, 11 Drawing Sheets

(51) Int. Cl.
*H01L 23/14* (2006.01)
*H01L 23/498* (2006.01)

(56) References Cited

U.S. PATENT DOCUMENTS

| | | |
|---|---|---|
| 7,977,785 B2 | 7/2011 | Tang |
| 8,008,125 B2 | 8/2011 | McConnelee et al. |
| 8,319,318 B2 | 11/2012 | Nalla et al. |
| 8,335,084 B2 | 12/2012 | Lee et al. |
| 8,653,670 B2 | 2/2014 | McConnelee et al. |
| 8,658,473 B2 | 2/2014 | McConnelee et al. |
| 8,664,656 B1 | 3/2014 | Arnold et al. |
| 2009/0072384 A1 | 3/2009 | Wong et al. |
| 2010/0140779 A1* | 6/2010 | Lin ................ H01L 23/49816 257/690 |
| 2010/0288535 A1* | 11/2010 | Hong ................ H01L 23/5389 174/252 |
| 2011/0068461 A1 | 3/2011 | England |
| 2013/0256900 A1 | 10/2013 | McConnelee et al. |
| 2014/0070396 A1 | 3/2014 | Kyozuka et al. |
| 2014/0093999 A1 | 4/2014 | Teh et al. |

\* cited by examiner

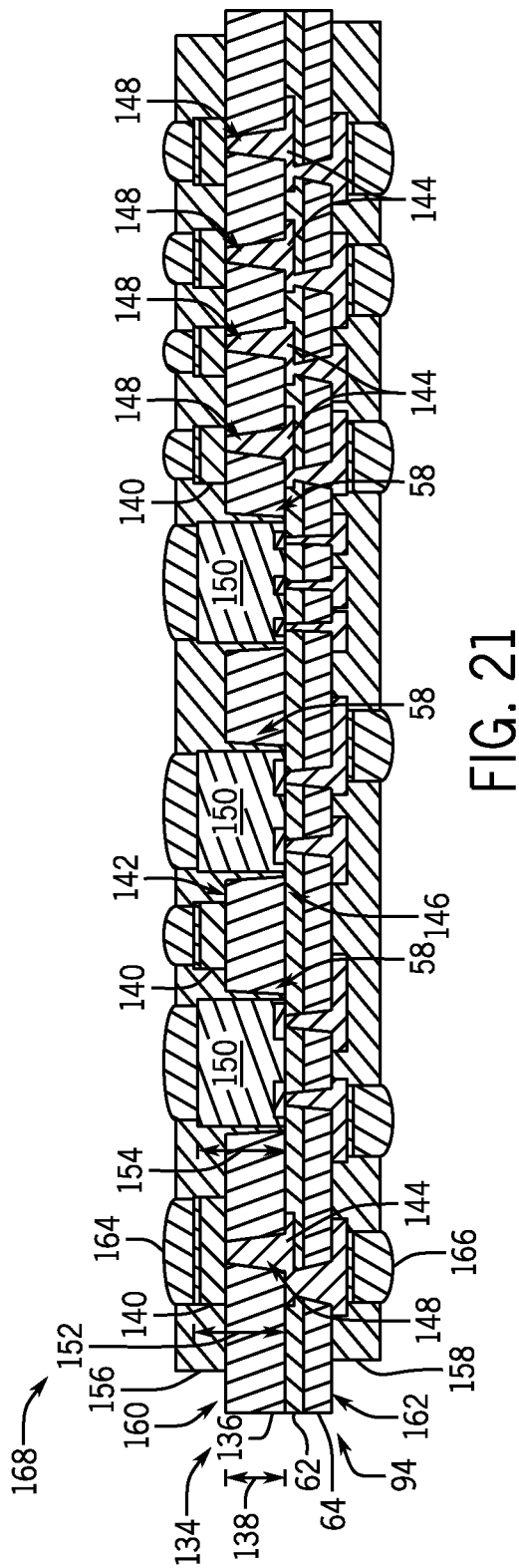

ELECTRICAL INTERCONNECT STRUCTURE FOR AN EMBEDDED ELECTRONICS PACKAGE

CROSS REFERENCE TO RELATED APPLICATION

The present application is a continuation of and claims priority to U.S. Non-Provisional patent application Ser. No. 14/464,877, now U.S. Pat. No. 9,653,438, filed Aug. 21, 2014, the disclosure of which is incorporated herein by reference in its entirety.

BACKGROUND OF THE INVENTION

Embodiments of the invention relate generally to embedded semiconductor device packages or electronics packages and, more particularly, to a semiconductor device package that incorporates an electrical interconnect structure or functional web assembly that forms I/O connections to die and other electrical components within the electronics package while minimizing the overall thickness of the electronics package as compared to prior art devices that incorporate a printed circuit board (PCB).

As semiconductor device packages have become increasingly smaller and yield better operating performance, packaging technology has correspondingly evolved from leaded packaging, to laminated-based ball grid array (BGA) packaging, to chip scale packaging (CSP), then flipchip packages, and now buried die/embedded chip build-up packaging. Advancements in semiconductor chip packaging technology are driven by ever-increasing needs for achieving better performance, greater miniaturization, and higher reliability. New packaging technology has to further provide for the possibilities of batch production for the purpose of large-scale manufacturing thereby allowing economy of scale while addressing demands of miniaturization.

A challenge to existing manufacturing techniques is the miniaturization of electronics packages that incorporate different types of individually packaged semiconductor dies or power devices. The individually packaged devices are commonly mounted on a multi-layer printed circuit board (PCB), which adds considerable thickness to the overall electronics package.

Accordingly, there is a need for a method of manufacturing embedded electronics packages that provides for a double-sided I/O system with an increased interconnection count and density, while minimizing the overall thickness of the electronics package.

BRIEF DESCRIPTION OF THE INVENTION

Embodiments of the invention overcome the aforementioned drawbacks by providing a build-up process for an embedded semiconductor device package that begins with the manufacture of a functional web assembly, which serves a dual purpose of adding rigidity to the electronics package and layers of electrical routing for I/O connections to top and bottom surfaces of the components within the package.

In accordance with one aspect of the invention, an electronics package includes a lower insulating layer, an upper insulating layer coupled to the lower insulating layer, and a conductive contact pad coupled to a second surface of the upper insulating layer. An electrical component is positioned within an opening formed through the upper insulating layer. A first interconnect layer extends through at least one via in the lower insulating layer to electrically couple with at least one contact pad on the electrical component and a second interconnect layer extends through at least one via in the upper insulating layer and electrically couples the first interconnect layer to the conductive contact pad.

In accordance with another aspect of the invention, an electronics package includes an upper insulating layer and at least one electrical component positioned within an opening in the upper insulating layer. A patterned contact layer includes a plurality of electrical connections, with a first electrical connection of the plurality of electrical connections extending across a top surface of the upper insulating layer and a first surface of the at least one electrical component. A lower insulating layer has a top surface coupled to a bottom surface of the upper insulating layer and a second surface of the at least one electrical component. The electronics package also includes an upper interconnect layer formed on the bottom surface of the upper insulating layer and electrically coupled to the patterned contact layer and a lower interconnect layer formed on a bottom surface of the lower insulating layer and electrically coupled to the upper interconnect layer and the at least one electrical component.

In accordance with yet another aspect of the invention, an electronics package includes a first insulating layer having at least one component opening formed therein and a first electrical component positioned within the at least one component opening. A first metallization layer is formed on a bottom surface of the first insulating layer and extends through at least one via formed therein. A second insulating layer is coupled to the first insulating layer and at least one metalized contact layer is formed on a top surface of the first insulating layer. A second metallization layer is formed on a bottom surface of the second insulating layer, the second metallization layer including a first portion electrically coupled to the first metallization layer and a second portion electrically coupled to at least one contact pad on the first electrical component. A combined thickness of the first insulating layer and the at least one metalized contact layer is substantially equal to a thickness of the first electrical component.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 21 is a schematic cross-sectional side view of an IC package incorporating a functional web structure according to an alternative embodiment of the invention.

DETAILED DESCRIPTION

Embodiments of the present invention provide for a method of forming an embedded die module or electronics package. The electronics package is manufactured to include a functional web assembly that adds rigidity to the embedded die package and provides additional layers of electrical routing. As described in detail below, embodiments of the functional web assembly include a dielectric layer having metalized electrical connections or interconnects on both sides and metalized via interconnects positioned therethrough. Die openings are formed within the functional web assembly that permit placement of chips or electrical components relative to the dielectric layer.

Embodiments of the invention are directed to build-up of an electronics package that includes one or more dies (i.e., chips) embedded within a plurality of patterned functional web layers that form routing layers within the electronics package. While the die embedded in the electronics package is referenced below in the embodiments of FIGS. 2-27 specifically as a die, it is understood that other electrical components could be substituted in the embedded die module for the die, and thus embodiments of the invention are not limited only to the embedding of chips/dies in an electronics package. That is, the use of dies/chips in the electronics package embodiments described below should also be understood to encompass other electrical components such as resistors, capacitors, inductors, filters, or other similar devices, that could be provided in the electronics package.

Figure 1:
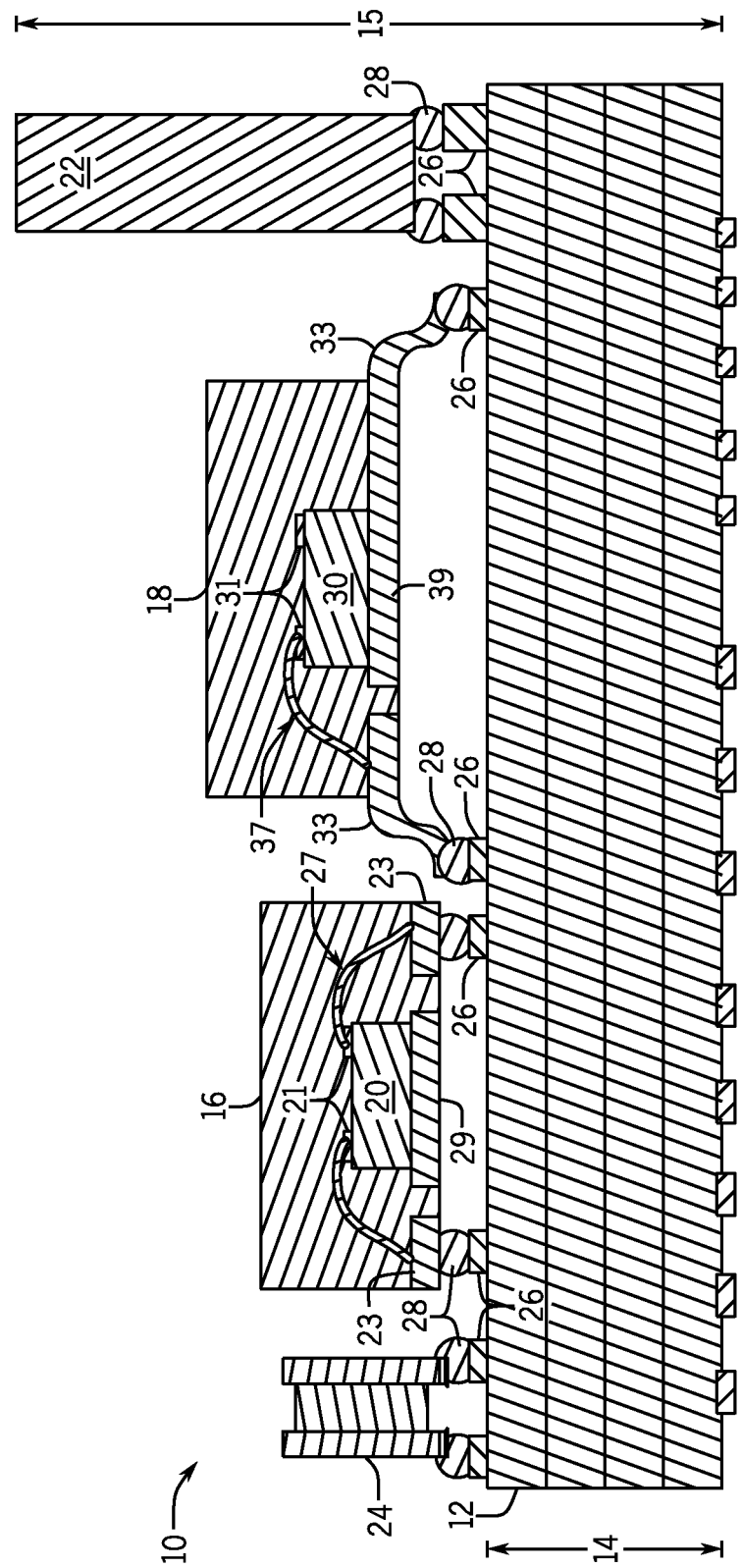
FIG. 1 is a schematic cross-sectional side view of a prior art integrated circuit (IC) package.

The general structure of a prior art electronics package 10 is shown in FIG. 1. The standard manufacturing process for the IC package 10 typically begins with a multilayer printed circuit board (PCB) 12 that has a thickness 14 of approximately 32 mils to 64 mils. Various discrete components 16, 18, for example die packages or packaged controllers, and other electrical components such as an inductor 22 and a passive component 24 may be electrically coupled to electrical contacts 26 of PCB 12 using metalized connections 28 such as, for example, solder balls in the form of a ball grid array (BGA). Each of discrete components 16, 18 includes a respective die 20, 30 having contact pads 21, 31 formed on an active surface thereof. Die 20, 30 are provided on a mounting platform 29, 39 and encased within an encapsulant or over-molding compound 25, 35. Wirebonds 27, 37 form direct metal connections between active surfaces of respective die 20, 30 and a metalized input/output (I/O) provided on or coupled to the lower surface of discrete components 16, 18. In the case of discrete component 16, wirebonds 27 form an electrical connection between contact pads 21 of die 20 to I/O pads 23 provided on a bottom surface of discrete component 16. Wirebond 37 electrically couples contact pads 31 to I/O leads 33. Where die 30 is a diode, for example, wirebond 37 may connect to the anode on a first surface of the die 30 and a second surface of the die may be soldered to the leadframe. I/O pads 23 and I/O leads 33 are coupled to electrical contacts 26 of PCB 12 by way of metalized connections 28. The overall thickness 15 of such prior art IC packages may be in the range of 500 μm-2000 μm or larger.

Referring now to FIGS. 2-17, a technique for manufacturing an electronics package 32 is set forth, according to an embodiment of the invention. A cross-section of a singular electronics package build-up process is shown in each of FIGS. 2-17 for ease of visualization of the build-up process, however, one skilled in the art will recognize that multiple electronics packages could be manufactured in a similar manner at the panel level and then singulated into individual electronics package components as desired. Also, each of the electronics packages may contain a single die or multiple die/chips/passives.

Figure 2:
FIGS. 2-17 are schematic cross-sectional side views of an integrated circuit (IC) package incorporating a functional web structure during various stages of a manufacturing/build-up process according to an embodiment of the invention.
Figure 3:
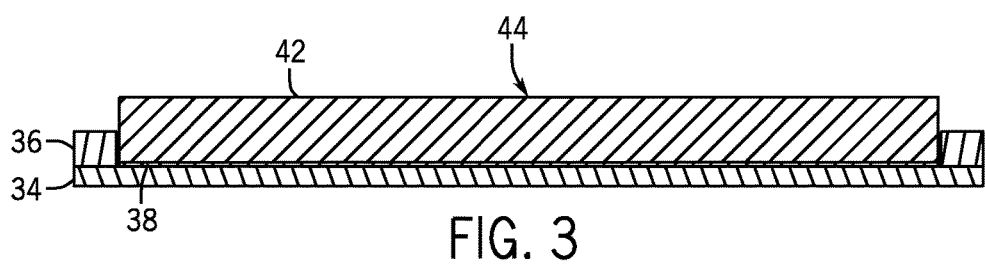

Fabrication of embedded die module 32 begins with an upper dielectric layer 34 or insulating film coupled to an optional frame 36 (shown in phantom), as shown in FIG. 2. In one embodiment upper dielectric layer 34 is Kapton® laminate flex, although other suitable materials may also be employed, such as Ultem®, polytetrafluoroethylene (PTFE), or another polymer film, such as a liquid crystal polymer (LCP) or a polyimide substrate. In one embodiment, upper dielectric layer 34 has a thickness of approximately 10 μm-50 μm. A metal seed layer 38 (FIG. 3) is formed on a top surface 40 of upper dielectric layer 34 and a metal layer 42, such as, for example, copper, is applied to metal seed layer 38. In one embodiment, metal seed layer 38 comprises titanium-copper and is formed using a sputter technique and metal layer 42 is applied using an electroplating process. In another embodiment, metal layer 42 is applied directly to the top surface 40 of upper dielectric layer 34 without a seed metal. In yet another embodiment, upper dielectric layer 34 can be copper clad before attaching to the frame 36, where the copper can be electrodeposited or laminated. The thickness of metal layer 42 may be selected depending on design requirements, such as, for example, die thickness, as described in more detail below. Metal layer 42 has a thickness of approximately 4 μm-150 μm in an exemplary embodiment. An optional titanium layer (not shown) may be applied to a top surface 44 of metal layer 42.

Figure 4:
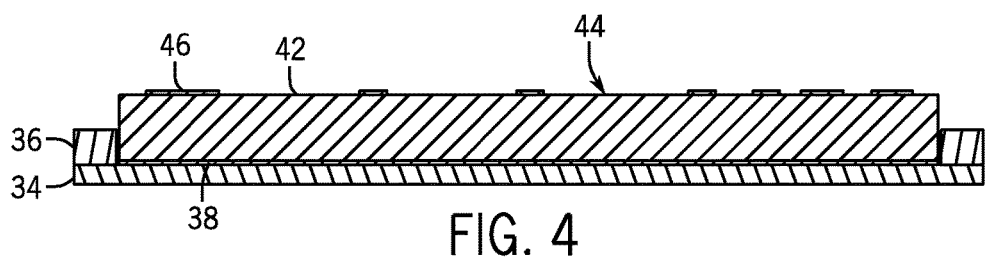

Referring to FIG. 4, in one embodiment of the invention the top surface 44 of metal layer 42 is then plated with a metallic coating or solderable coating 46, which is then patterned to form solder pads for solder attach of passive components in a later step of the fabrication process. Metallic coating 47 comprises a solderable metal, such as nickel-gold, as one non-limiting example, that facilitates solder adhesion and helps prevent solder from flowing along the entire top surface 44 of metal layer 42. However, it is contemplated that metallic coating 46 may be omitted in alternative embodiments where passive components are not included in the design or a metallic coating is not required for solder attach of passive components, or other methods like conductive adhesive are used. The metal layer 42 is then patterned. In embodiments incorporating metallic coating 46, the coating 46 may be used as an etch mask. Next, the metal layer 42 and metal seed layer 38 are etched to form a metalized contact layer 48 on top surface 44 of upper dielectric layer 34. In alternative embodiments, a semi-additive plating process may be used to form metalized contact layer 48.

Figure 5:
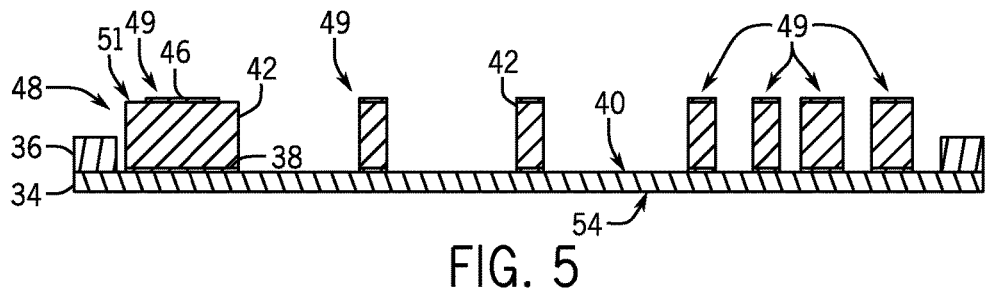

As shown in FIG. 5, some portions of metalized contact layer 48 may contain metallic coating 46, while others may not. The portions of metalized contact layer 48 that include metallic coating 46 function as metallic contact pads 49 to which electronic components may be attached using solder. The portions of metalized contact layer 48 that do not include metallic coating 46 function as electrical traces 51 to electrically connect various components provided within the electronic package, as illustrated in additional detail in FIG.

19. Accordingly, metalized contact layer 48 is formed having a combination of metallic contact pads 49 and traces 51. An exemplary arrangement of the contact pads 49 and traces 51 of metalized contact layer 48 is illustrated in additional detail in FIG. 19.

Figure 6:
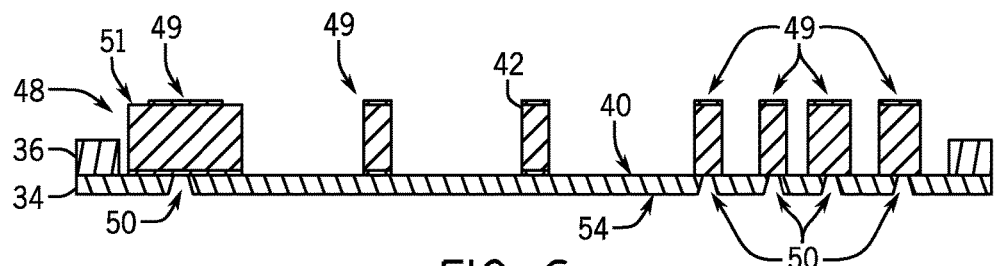
Figure 7:
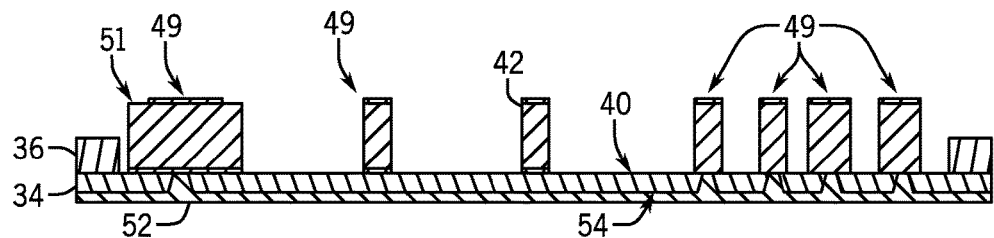
Figure 8:
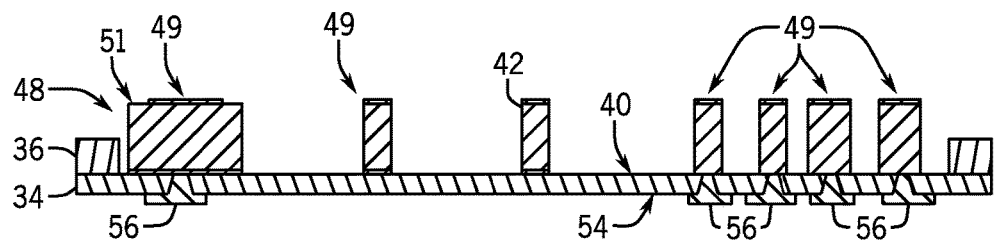

A number of vias 50 are formed through upper dielectric layer 34 at locations corresponding to the patterned copper layer 42, as shown in FIG. 6. Vias 50 may be formed by UV laser drilling or etching, for example. Alternatively, it is also recognized that vias 50 may be formed by way of other methods including: plasma etching, photo-definition, other laser techniques like CO2 and excimer, or mechanical drilling processes. In one embodiment, vias 50 are formed having angled side surfaces, as shown in FIG. 6, which facilitates later filling and metal deposition. A metal layer 52, such as copper, for example, is then formed on a bottom surface 54 of dielectric 34, as shown in FIG. 7. In one embodiment, an optional titanium-copper seed layer (not shown) is sputter-plated onto bottom surface 54 of dielectric 34 and through vias 50 prior to deposition of copper layer 52. After patterning metal layer 52, metal layer 52 and titanium-copper seed layer (if used) are etched to form an upper layer of metalized vias or metal interconnections 56 on the bottom surface 54 of upper dielectric layer 34 that extend through vias 50, as shown in FIG. 8. Alternatively, the pattern of metal interconnections 56 may be created using a semi-additive plating process. The upper layer of metalized vias 56 thus form electrical connections between the bottom surface 54 of upper dielectric layer 34 and the metalized contact layer 48 on the top surface 40 of upper dielectric layer 34.

Figure 9:
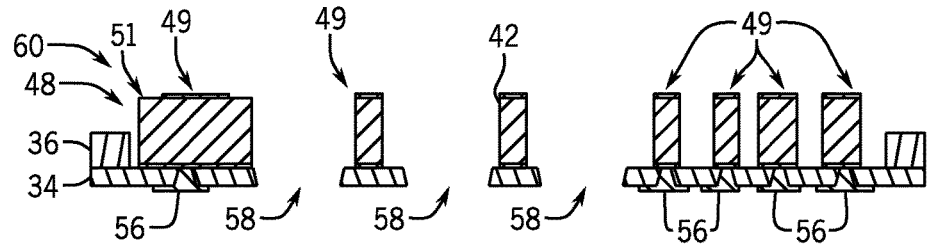

Next, one or more die openings 58 are formed through upper dielectric layer 34, as shown in FIG. 9. Die openings 58 are sized to be slightly larger than the corresponding die. In one non-limiting example, die openings 58 are sized to be approximately 10 μm larger than the corresponding die. In one embodiment, die openings 58 are formed using a laser, which may be used to control the angle of the side walls 59 of the die openings 58. FIG. 9 illustrates one embodiment wherein die openings 58 are formed having angled side walls 59 to facilitate placement of die into die openings 58. Alternatively, die openings 58 may be formed with straight or vertical side walls.

The resulting first level functional web assembly 60 includes upper dielectric layer 34 with metalized contact layer 48 and upper layer of metalized vias 56 formed thereon. It is contemplated that the thickness of metalized contacts 48 and/or the upper layer of metalized vias 56 may be varied based on design specifications. For example, one or both of metalized contact layer 48 and the upper layer of metalized vias 56 may be designed with an increased thickness to handle a high current application.

Additional metal interconnection layers may be added to first level functional web assembly 60 prior to attaching die components to functional web assembly 60 in order to increase the interconnect density and routing capabilities of functional web assembly 60. For example, in a next step of the manufacturing process, an adhesive layer 62 may be applied to the bottom surface 54 of upper dielectric layer 34 and to the upper layer of metalized vias 56. According to one embodiment, adhesive layer 62 is first applied onto a lower dielectric layer 64 that is coupled to an optional oversized frame 66 shown in FIG. 10. According to various embodiments, adhesive layer 62 may be applied using a coating technique such as spin coating or slot die coating, or may be applied by a programmable dispensing tool in the form of an inkjet printing-type device technique, as non-limiting examples. After adhesive layer 62 is applied onto upper dielectric layer 34, a lamination technique carried out to couple upper dielectric layer 34 to lower dielectric layer 64.

Figure 11:
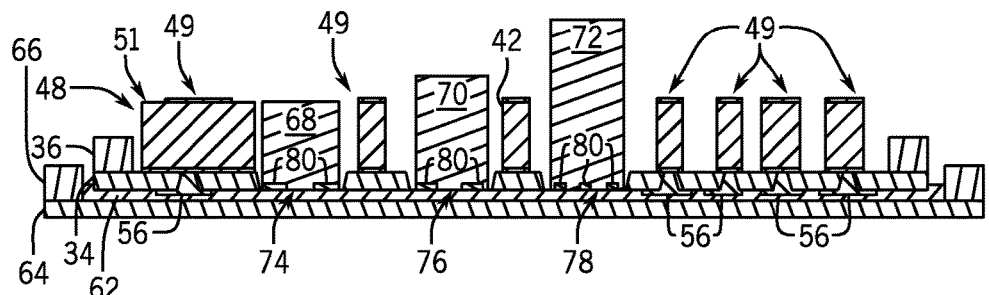

Referring to FIG. 11, one or more die 68, 70, 72 are placed within the die openings 58 formed in upper dielectric layer 34. Die 68, 70, 72 may be of varying thickness, as shown in FIG. 11, or of the same thickness in an alternative embodiment. In one non-limiting embodiment, thinned die having a thickness of approximately 50 μm may be placed within die openings 58. As shown, die 68, 70, 72 are positioned such that an active surface 74, 76, 78 comprising contact pads 80 is positioned into adhesive layer 62. While not shown in the illustrated embodiment, it is contemplated that passive devices, such as, for example, a resistor, a capacitor, or an inductor, may be placed into adhesive layer 62 in a respective die opening 58 in a similar manner as described above with respect to die 68, 70, 72.

As die 68, 70, 72 are positioned within die openings 58, a portion of adhesive layer 62 travels up the sides of die 68, 70, 72 to fill the space between dielectric layer 34 and die 68, 70, 72. Any portion of die opening 58 that remains unfilled either by adhesive layer 62 or die 68, 70, 72 may be filled with an encapsulant 132 in a later processing step. After die 68, 70, 72 are positioned, adhesive layer 62 may be fully cured, thermally or by a combination of heat or radiation. Suitable radiation may include UV light and/or microwaves. A partial vacuum and/or above atmospheric pressure may be used to promote the removal of volatiles from the adhesive during cure if any are present. Because die openings 58 are sized to be just slightly larger than die 68, 70, 72 (e.g., approximately 10 μm larger), die 68, 70, 72 self-align within dielectric layer 34. Die openings 58 also prevent die 68, 70, 72 from moving or swimming out of position as adhesive layer 62 is fully cured.

Figure 12:
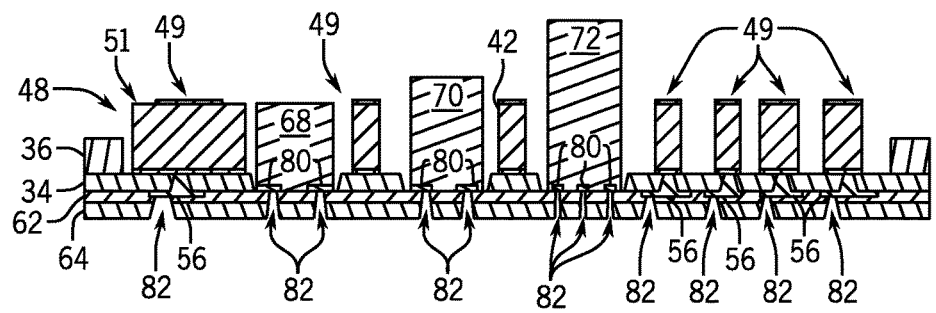

Next, oversized frame 66 is removed and a second layer of vias 82 are formed through lower dielectric layer 64 and adhesive layer 62. As shown in FIG. 12, the second layer of vias 82 extend to corresponding locations on metalized vias 56 and die 68, 70, 72. It is contemplated that vias 82 may vary in size depending on current requirements and die pad size.

Figure 13:
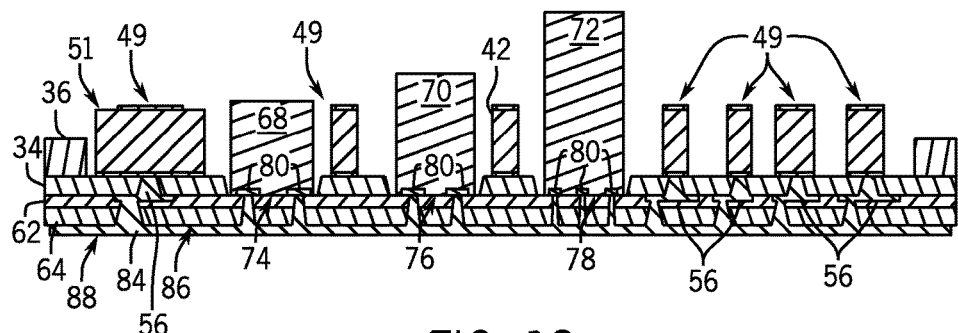

After forming the second layer of vias 82, a metallization layer 84 is applied to coat a bottom surface 86 of lower dielectric layer 64 and extend through second layer of vias 82 as shown in FIG. 13. In one embodiment, a metal coating layer such as a titanium-copper seed layer (not shown) is sputter deposited onto the bottom surface 86 of lower dielectric layer 64 before application of metallization layer 84. Optionally, a titanium layer (not shown) may be applied to the bottom surface 88 of metallization layer 84. Frame 36 then may be removed.

Figure 14:
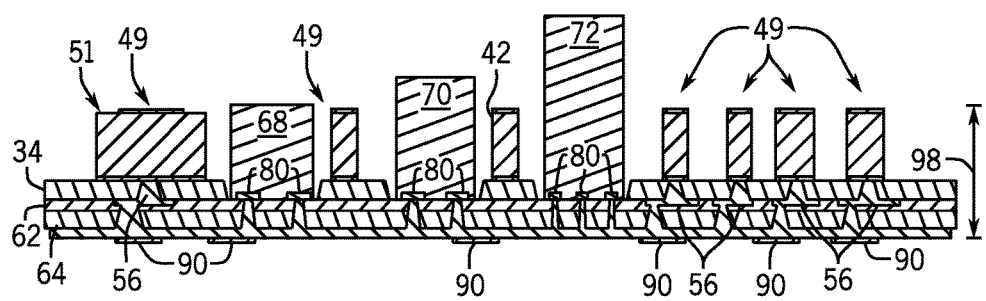
Figure 15:
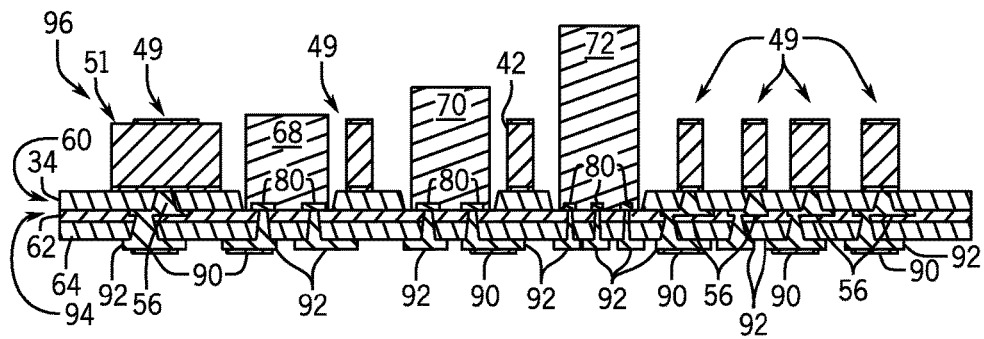

Referring now to FIG. 14, a solderable metal coating 90, such as, for example, nickel-gold, is applied to bottom surface 88 of metallization layer 84. Next, metallization layer 84 is patterned and etched to form a lower layer of metalized vias or metalized interconnections 92, as shown in FIG. 15. The lower layer of metalized vias 92 comprise electrical connections to die 68, 70, 72 and the upper layer of metalized vias 56. In one alternative embodiment, the lower layer of metalized vias 92 may be formed using a semi-additive plating technique. Together, adhesive layer 62, lower layer of metalized vias 92, and solderable metal coating 90 form a second level functional web assembly 94.

It is contemplated that a functional web assembly 96 comprising first level functional web assembly 60 and second level functional web assembly 94 may be manufactured as a pre-fabricated module with or without die 68, 70,

72. In an embodiment where functional web assembly 96 is manufactured without die 68, 70, 72, adhesive layer 62 may be provided in a partially cured state (e.g., as a B-stage material) that is stable enough for further handling or transport. This will permit die 68, 70, 72 to be subsequently attached to functional web assembly 96 in a later processing step. In one embodiment, functional web assembly 96 has a thickness 98 of approximately 5 mils.

According to embodiments of the invention, it is recognized that additional layers of dielectric and metalized vias may be added beyond second level functional web assembly 94 during further build-up steps of functional web assembly 96, with the number of additional levels of functional webs applied being dependent on design considerations of the final package.

Figure 16:
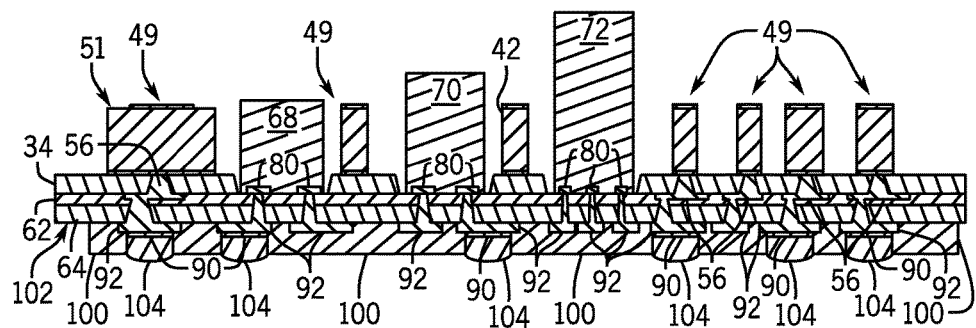

After application of the levels of the functional web assembly 96, a solder mask 100 may be applied to the outermost bottom surfaces 102 of functional web assembly 96. In the illustrated embodiment, solder mask 100 is applied to portions of the bottom surface 86 of lower dielectric layer 64 and the lower layer of metalized vias 92 and patterned as shown in FIG. 16. While not shown in FIG. 16, it is contemplated that a second solder mask may be formed on select upward-facing surfaces metalized contact layer 48, upper dielectric layer 34, and dies 68, 70, 72 as desired by application. Following application of solder mask 100, a lower solder layer 104 may be formed as shown. Lower solder layer 104 provides I/O connections to the bottom surfaces 102 of functional web assembly 96. In one embodiment, lower solder layer 104 is formed as balls that are soldered to solder mask 100 (e.g., solder balls forming a Ball Grid Array (BGA)). It is also envisioned, however, that other forms of I/O interconnections 84 can be attached, such as plated bumps, pillar bumps, gold stud bumps, metal filled polymer bumps, or wirebond connections/pads, such that electrical connections can be made between the electrical components within functional web assembly 96 and external components (not shown) such as, for example, a motherboard or printed circuit board (PCB).

Figure 17:
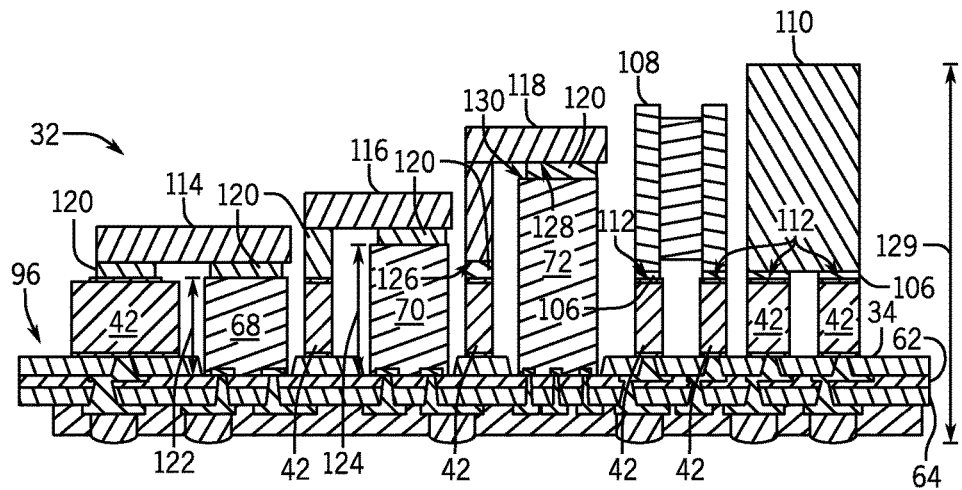

A solder layer 106 is used to couple passive components or other solderable devices 108, 110 to respective metalized contact pads 49 of metalized contact layer 48, as shown in FIG. 17. In the illustrated embodiment, each passive component 108, 110 is coupled to respective upper surfaces 112 of a pair of metalized contact pads 49 of metalized contact layer 48. The resulting thickness 129 of embedded die module 32 may vary according to application and depending on the relative thinness or thickness of the die encorporated into the module. In one non-limiting example, embedding die module 32 may be manufactured having a thickness 129 of approximately 175 µm-270 µm, according to embodiments of the invention.

A metal bridge, conductive element, or shorting bar 114, 116, 118 is also used to electrically couple each die 68, 70, 72 to a respective metalized contact pad 49. In one embodiment solder 120 is used to electrically couple shorting bars 114, 116, 118 to die 68, 70, 72. Alternatively another joining material having desirable electrical and thermal conductivity properties, such as, for example, sintered silver, may be used in place of solder. As shown in the case of die 68 and die 70, the thickness of the solder 120 between the shorting bar 114, 116 and the metalized contact 48 may be varied to account for the differing thickness 122, 124 of dies 68, 70. While shorting bars 114, 116, 118 are illustrated in FIG. 17 as being provided for each die 68, 70, 72, one skilled in the art will recognize that shorting bars may be omitted for dies having only one active surface.

Alternatively, the geometry of the shorting bar may be altered to account for differing die thickness. For example, shorting bar 118 is provided having an L-shaped cross-sectional geometry as shown in FIG. 17, with a first surface 126 of the shorting bar 118 in contact with a metalized contact 48 through solder 118 and a second surface 128 of the shorting bar 118 in contact with the second active side 130 of die 72 through solder 118. Shorting bar 118 may be machined to have the L-shape cross-section in one embodiment, or be constructed having a pair of rectangular slabs joined together with an adhesive such as a conductive epoxy in alternative embodiments.

Figure 18:
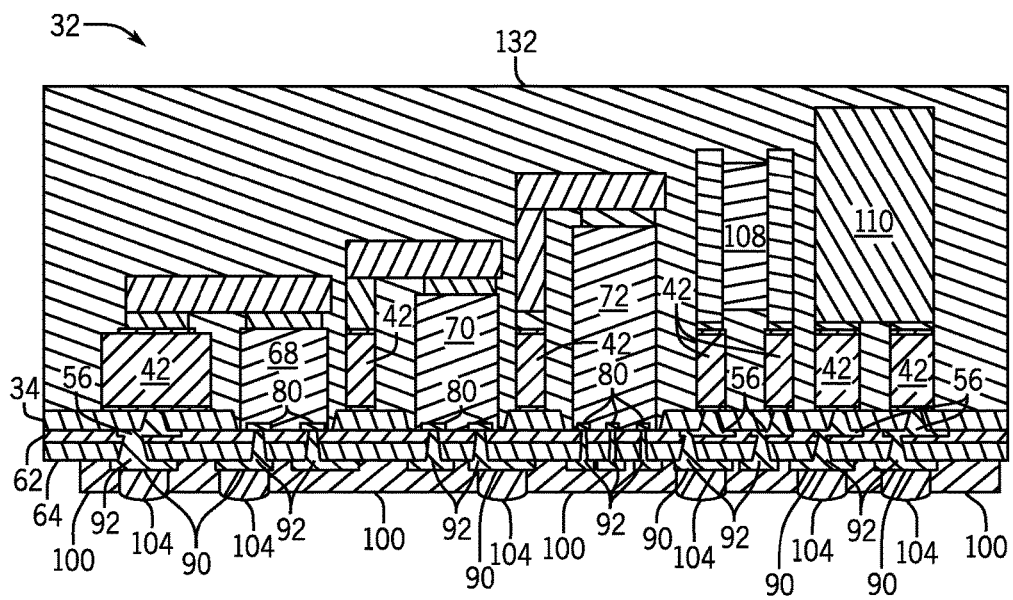
FIG. 18 is a schematic cross-sectional side view of an IC package incorporating a functional web structure during an optional step of the manufacturing/build-up process of FIGS. 2-17 according to an embodiment of the invention.

Optionally, die 68, 70, 72 and passive components 108, 110 may be overcoated with an encapsulant 132, as illustrated in FIG. 18. Encapsulant 132 may be used, for example, in high voltage applications to prevent arching between die and metal components or to provide rigidity and ease of handling. The resulting electronics package 32 (with or without encapsulant 132) may then be cleaned, inspected, and singulated if desired.

Figure 20:
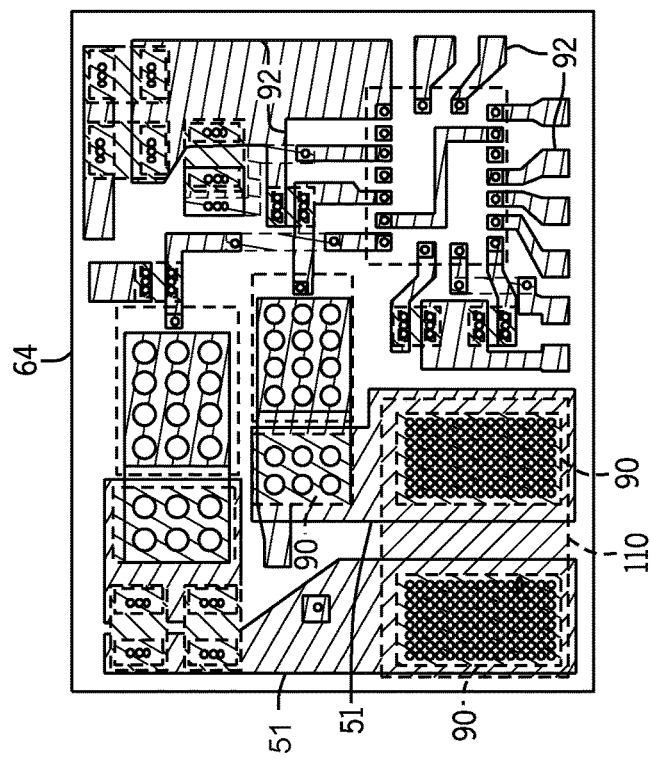
FIGS. 19 and 20 are respective schematic bottom and top views of an IC package manufactured in accordance with the manufacturing/build-up process of FIGS. 2-16.
Figure 19:
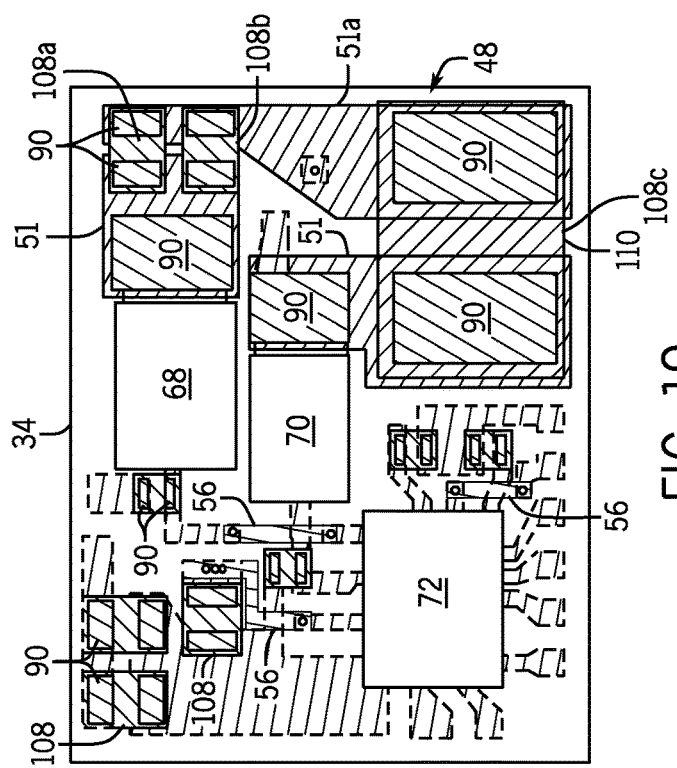

FIGS. 19 and 20 illustrate respective bottom and top views of an electronics package manufactured in accordance with the manufacturing/build-up process of FIGS. 2-15 and prior to application of shorting bars 114, 116, 118, solder mask 100, solder layer 104, encapsulant 132. In the bottom or backside view of FIG. 19, an exemplary arrangement of various die 68, 70, 72, passive components 108, 110, metalized contact layer 48, and metal interconnections 56 formed on dielectric layer 34. The top or frontside view of FIG. 20 illustrates a corresponding exemplary arrangement of metalized interconnections 92 formed on dielectric layer 64.

As shown in FIG. 19, metal contact layer 48 is patterned to create a routing layer atop dielectric layer 34 to electrically connect various electrical components. For example, portion 51a of metal contact layer 48 forms an electrical connection between passive components 108a, 108b, and 108c. The locations of metal contact layer 48 that include metal coating 90 form contact locations to which active and passive components may coupled using solder. Accordingly, metal contact layer 48 serves the dual function as a routing layer and as a solderable contact layer for attachment of electrical components.

In addition, the order and sequence the process or method steps associated with the above-described manufacturing or build-up technique may be varied according to alternative embodiments. As one non-limiting example, the solderable metal coating 90 may be applied following solder mask 100.

It is contemplated that the thickness of metalized contact layer 48 and/or the upper layer of metalized vias 56 may be varied based on design specifications. For example, one or both of metalized contact layer 48 and the upper layer of metalized vias 56 may be designed with an increased thickness to handle a high current application. Referring now to FIG. 21, a functional web assembly 134 is shown according to another embodiment of the invention. Functional web assembly 134 and functional web assembly 96 (FIG. 15) share a number of common components. Elements and components common to functional web assembly 134 and functional web assembly 96 will be discussed relative to the same reference numbers as appropriate.

As shown, functional web assembly 134 includes an upper dielectric layer 136 having die openings 58 formed through a thickness 138 thereof. Metalized contacts 140 are formed in a manner similar to metalized contact layer 48 (FIG. 5) on a top surface 142 of upper dielectric layer 136. An upper layer of metalized vias 144 is formed on a bottom surface 146 of upper dielectric layer 136 and extend through vias 148 formed through upper dielectric layer 136, similar to upper layer of metalized vias 56 (FIG. 8). A second functional web assembly 94 is coupled to upper dielectric layer 136 via adhesive layer 62. A plurality of die 150 are positioned in corresponding die openings 58 of functional web assembly 134.

A thickness 138 of upper dielectric layer 136 is greater than the thickness of upper dielectric layer 34 of functional web assembly 96. In one embodiment, a combined thickness 152 of upper dielectric layer 136 and metalized contacts 140 is substantially equal to a thickness 154 of die 150 as shown in FIG. 21. Alternatively, upper dielectric layer 136 may be provided having a thickness approximately equal to thickness 154 of die 150.

An upper solder mask 156 and a lower solder mask 158 are formed on respective upper and lower surfaces 160, 162 of functional web assemblies 134, 94 to permit formation of upper and lower solder layers 164, 166. The resulting electronics package 168 allows for ball grid array (BGA) attachment to both sides of the electronics package 168 as shown. Further, the resulting electronics package 168 has a substantially planar structure that permits stacking of multiple electronics packages or modules. In the embodiment illustrated in FIG. 21, metalized contacts 140 are manufactured as part of functional web assembly 134 and prior to placement of die 150.

Referring now to FIGS. 22-27, a technique for manufacturing an electronics package 170 incorporating a functional web assembly 172 is described according to an alternative embodiment of the invention. FIGS. 22-27 illustrate cross-sectional views of electronics package 170 and/or functional web assembly 172 during the various steps of the build-up process. As functional web assembly 172 and functional web assembly 96 (FIG. 15) share a number of common components, these common components will be discussed relative to the same reference numbers as appropriate.

Figure 22:
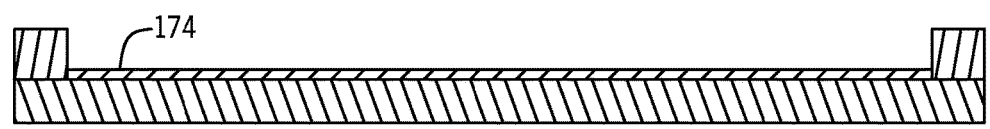
FIGS. 22-27 are schematic cross-sectional side views of an integrated circuit (IC) package incorporating a functional web structure during various stages of a manufacturing/build-up process according to another embodiment of the invention.
Figure 23:
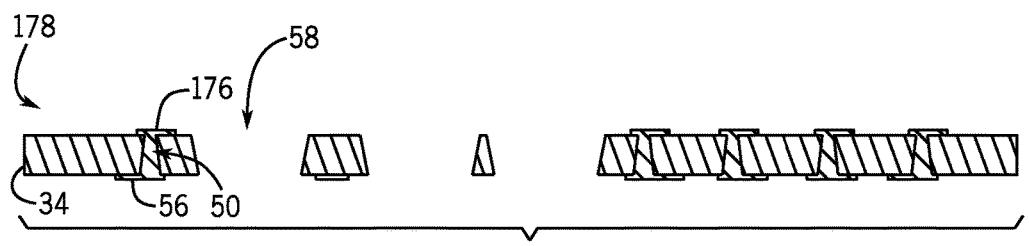

Referring first to FIG. 22, an upper metallization layer 174 is formed on a top surface 40 of upper dielectric layer 34, either with or without a seed metal layer according to various embodiments. Alternatively, upper metallization layer 174 may be provided as a metallic cladding applied to upper dielectric layer 34 prior to attachment to frame 36. This layer 174 is then patterned and etched to form a plurality of metallic interconnects 176, as shown in FIG. 23. After forming vias 50 in a similar manner as described with respect to FIG. 6, an upper layer of metalized vias 56 is formed on the bottom surface 54 of upper dielectric layer 34 in a similar manner as described with respect to FIG. 7 and FIG. 8. In an alternative embodiment vias 50 may be formed prior to plating upper and lower surfaces of dielectric layer 34 with metal. Die openings 58 are then formed through the thickness of upper dielectric layer 34. The resulting first level functional web assembly 178 includes upper dielectric layer 34, a plurality of metallic interconnects 176, upper layer of metalized vias 56, and die openings 58.

Figure 10:
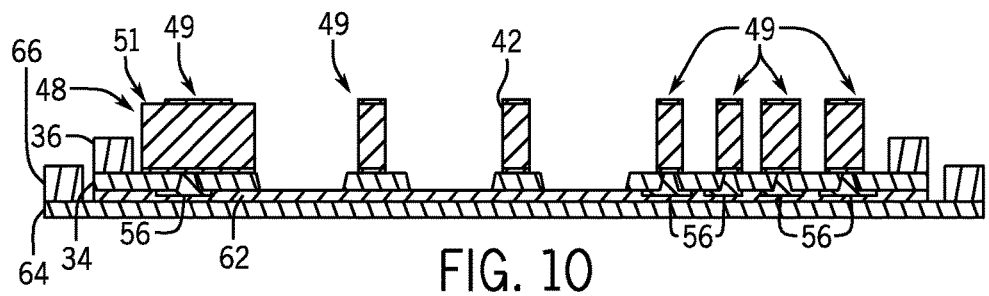
Figure 24:
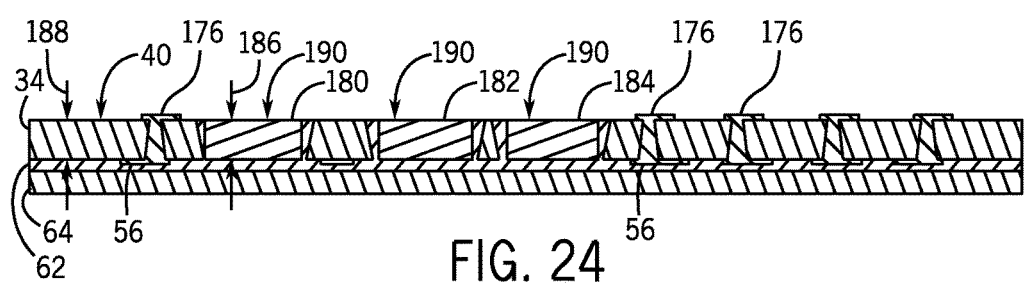

Lower dielectric layer 64 is then coupled to first level functional web assembly 178 using an adhesive layer 62 in the manner described with respect to FIG. 10 and one or more die 180, 182, 184 are positioned within die openings 58, as shown in FIG. 24. As shown, die 180, 182, 184 have a thickness 186 substantially equal to the thickness 188 of upper dielectric layer 34 such that the top surface 40 of upper dielectric layer 34 and the non-active surface 190 of die 180, 182, 184 are substantially coplanar.

Figure 25:
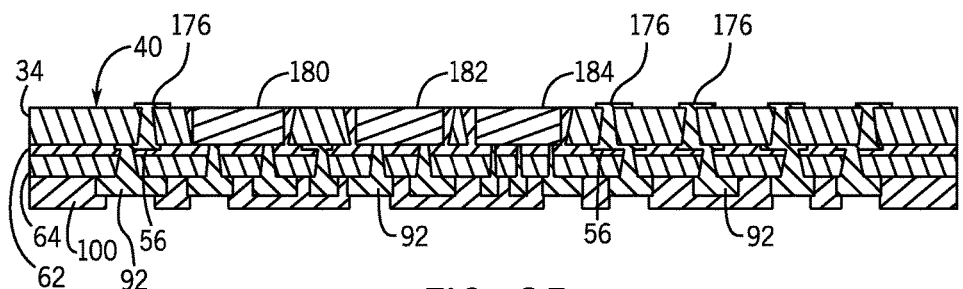
Figure 26:
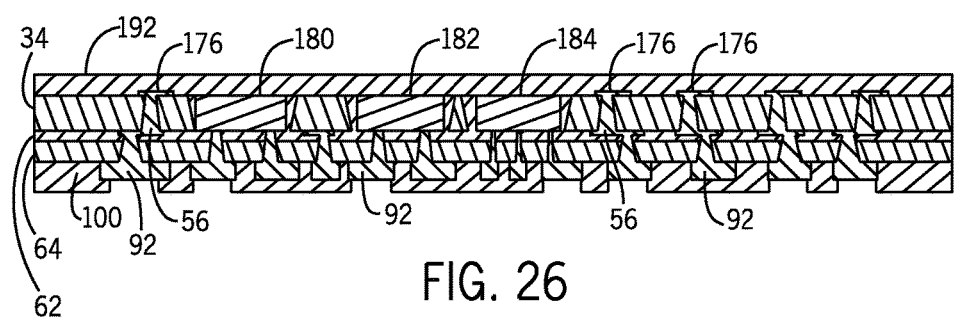

A second layer of metalized vias or metalized interconnections 92 is then formed through lower dielectric layer 64 and adhesive layer 62 as illustrated in FIG. 25. Solder mask 100 may then be applied to the bottom surface 86 of lower dielectric layer 64 and lower layer of metalized vias 92, as shown. Next, a metal contact layer 192 is formed on the top surface 40 of upper dielectric layer 34 and across the non-active surface 190 of die 180, 182, 184, as shown in FIG. 26. While metal contact layer 192 and the layer of metalized interconnections 92 are described above as being formed in separate steps, it is contemplated that both layers 92, 192 may be deposited at the same time in an alternative embodiment.

Figure 27:
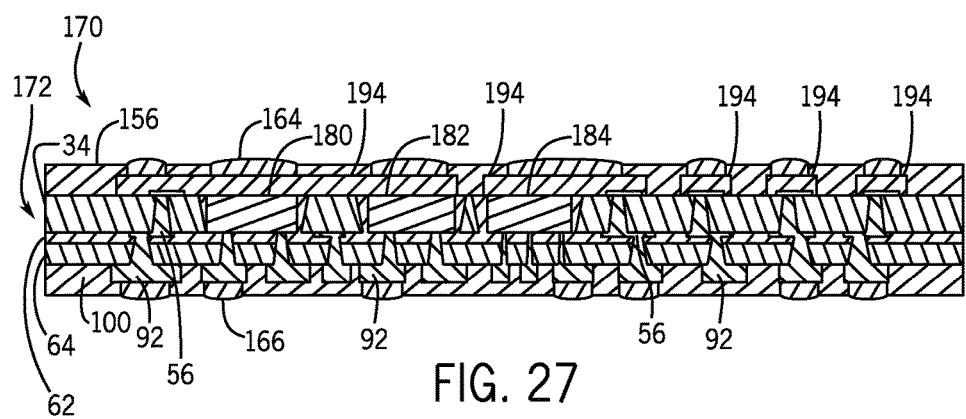

The metal contact layer 192 is then patterned and etched to form a plurality of metal contact interconnections 194, as shown in FIG. 27. Metal contact interconnections 194 function similar to shorting bars 114, 116, 118 of FIG. 17 by forming electrical connections between non-active surfaces of dies 180, 182, 184 and the upper layer of metalized vias 56.

An upper solder mask 156 may then be formed on top surface 40 of upper dielectric layer 34 and portions of plurality of metal contact interconnections 194 followed by formation of upper solder layer 164 and lower solder layer 166. The resulting electronics package 170 may then be cleaned, inspected, and singulated if desired.

Accordingly, embodiments of the invention include an interconnect assembly, referred to herein as a functional web assembly, that may be incorporated into an electronics package to allow for input/output from multiple die and other electrical components.

Beneficially, embodiments of the invention thus provide an electronics package that includes embedded dies and other electrical components. The functional web assembly provided within the electronics package is manufactured to provide desired electrical interconnections between the top and bottom surfaces of the electrical components within the electronics package, thereby eliminating the need for a bulky multilayer PCB within the package. By providing the electrical interconnections within the functional web assembly, the overall volume of the electronics package may be reduced by approximately 35% while increasing the power density by approximately 50% as compared to an electronics package incorporating a multilayer PCB.

Additionally, the thickness of the various material layers within the functional web assembly may be varied to accommodate various die dimensions and combinations of differing dies and electrical components while minimizing the overall thickness of the electronics package.

Further, because the functional web assembly may be pre-fabricated, the interconnections may be tested prior to being incorporated into an electronics package, thereby improving the yield of the final assembled electronics package.

Therefore, according to one embodiment of the invention, an electronics package includes a lower insulating layer, an upper insulating layer coupled to the lower insulating layer, and a conductive contact pad coupled to a second surface of the upper insulating layer. An electrical component is positioned within an opening formed through the upper insulating layer. A first interconnect layer extends through at least one via in the lower insulating layer to electrically couple with at least one contact pad on the electrical component and a second interconnect layer extends through at least one via in the upper insulating layer and electrically couples the first interconnect layer to the conductive contact pad.

According to another embodiment of the invention, an electronics package includes a first insulating layer having at least one component opening formed therein and a first electrical component positioned within the at least one component opening. A first metallization layer is formed on a bottom surface of the first insulating layer and extends through at least one via formed therein. A second insulating layer is coupled to the first insulating layer and at least one metalized contact layer is formed on a top surface of the first insulating layer. A second metallization layer is formed on a bottom surface of the second insulating layer, the second metallization layer including a first portion electrically coupled to the first metallization layer and a second portion electrically coupled to at least one contact pad on the first electrical component. A combined thickness of the first insulating layer and the at least one metalized contact layer is substantially equal to a thickness of the first electrical component.

According to yet another embodiment of the invention, an electronics package includes an upper insulating layer and at least one electrical component positioned within an opening in the upper insulating layer. A patterned contact layer includes a plurality of electrical connections, with a first electrical connection of the plurality of electrical connections extending across a top surface of the upper insulating layer and a first surface of the at least one electrical component. A lower insulating layer has a top surface coupled to a bottom surface of the upper insulating layer and a second surface of the at least one electrical component. The electronics package also includes an upper interconnect layer formed on the bottom surface of the upper insulating layer and electrically coupled to the patterned contact layer and a lower interconnect layer formed on a bottom surface of the lower insulating layer and electrically coupled to the upper interconnect layer and the at least one electrical component.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
a lower insulating layer;
an upper insulating layer coupled to the lower insulating layer;
a conductive contact pad coupled to a surface of the upper insulating layer;
an electrical component positioned within an opening formed through the upper insulating layer;
a first interconnect layer extending through at least one via in the lower insulating layer to electrically couple with at least one contact pad on the electrical component; and
a second interconnect layer extending through at least one via in the upper insulating layer and electrically coupling the first interconnect layer to the conductive contact pad.

2. The electronics package of claim 1 wherein a first portion of the second interconnect layer is positioned between the upper insulating layer and the lower insulating layer; and
wherein a second portion of the second interconnect layer extends through the at least one via in the upper insulating layer.

3. The electronics package of claim 2 wherein the first portion of the second interconnect layer is formed on a surface of the upper insulating layer that faces the lower insulating layer.

4. The electronics package of claim 1 wherein a portion of the first interconnect layer is formed on a surface of the lower insulating layer that faces away from the electrical component.

5. The electronics package of claim 1 further comprising at least one of an adhesive and an encapsulant positioned adjacent the electrical component within the opening of the upper insulating layer.

6. The electronics package of claim 1 further comprising a conductive bar positioned atop the conductive contact pad and the electrical component and spanning a distance therebetween.

7. The electronics package of claim 6 further comprising a conductive joining material coupling the conductive bar to the conductive contact pad and a surface of the electrical component.

8. The electronics package of claim 1 further comprising:
a pair of conductive contact pads coupled to the upper insulating layer adjacent the conductive contact pad; and
a passive component mounted on the pair of conductive contact pads.

9. The electronics package of claim 1 further comprising a plurality of input/output (I/O) connections formed on the first interconnect layer.

10. The electronics package of claim 1 wherein the conductive contact pad is plated with a solderable coating.

11. The electronics package of claim 1 wherein the upper insulating layer is coupled to the lower insulating layer with an adhesive.

12. The electronics package of claim 11 wherein the adhesive fills a space between the upper insulating layer and the electrical component within the opening.

13. An electronics package comprising:
a first insulating layer having at least one component opening formed therein;
a first electrical component positioned within the at least one component opening;
a first metallization layer formed on a bottom surface of the first insulating layer and extending through at least one via formed therein;
a second insulating layer coupled to the first insulating layer;
at least one metalized contact layer formed on a top surface of the first insulating layer; and
a second metallization layer formed on a bottom surface of the second insulating layer, the second metallization layer comprising a first portion electrically coupled to the first metallization layer and a second portion electrically coupled to at least one contact pad on the first electrical component;
wherein a combined thickness of the first insulating layer and the at least one metalized contact layer is substantially equal to a thickness of the first electrical component.

14. The electronics package of claim 13 further comprising:
an upper ball grid array (BGA) attachment layer defining a first outer surface of the electronics package; and a lower BGA attachment layer defining a second outer surface of the electronics package, opposite the first outer surface.

15. The electronics package of claim 14 wherein the upper BGA attachment layer and the lower BGA attachment layer comprise solder.

16. The electronics package of claim 13 wherein the first insulating layer is thicker than the second insulating layer.

17. The electronics package of claim 13 wherein the at least one component opening comprises a first component opening and a second component opening;
wherein the first electrical component is positioned within the first component opening; and
further comprising a second electrical component positioned within the second component opening.

18. An electronics package comprising:
an upper insulating layer;
at least one electrical component positioned within an opening in the upper insulating layer;
a patterned contact layer comprising a plurality of electrical connections, wherein a first electrical connection of the plurality of electrical connections extends across a top surface of the upper insulating layer and a first surface of the at least one electrical component;
a lower insulating layer having a top surface coupled to a bottom surface of the upper insulating layer and a second surface of the at least one electrical component;
an upper interconnect layer formed on the bottom surface of the upper insulating layer and electrically coupled to the patterned contact layer; and
a lower interconnect layer formed on a bottom surface of the lower insulating layer and electrically coupled to the upper interconnect layer and the at least one electrical component.

19. The electronics package of claim 18 wherein the upper interconnect layer extends through at least one via in the upper insulating layer to electrically couple with the patterned contact layer;
wherein the lower interconnect layer extends through at least a first via in the lower insulating layer to electrically couple with the upper interconnect layer; and
wherein the lower interconnect layer extends through at least a second via in the lower insulating layer to electrically couple with at least one contact pad on a second surface of the at least one electrical component.

20. The electronics package of claim 18 wherein respective top surfaces and respective bottom surfaces of the at least one electrical component and the upper insulating layer are co-planar.

21. The electronics package of claim 18 further comprising:
an upper ball grid array (BGA) attachment layer formed on the patterned contact layer; and
a lower BGA attachment layer formed on the lower interconnect layer.

22. The electronics package of claim 18 wherein the first surface of the at least one electrical component comprises a non-active surface.

23. The electronics package of claim 18 wherein the at least one electrical component comprises a first electrical component and a second electrical component;
wherein the first electrical connection couples a non-active surface of the first electrical component to a first portion of the upper interconnect layer; and
wherein a second electrical connection of the plurality of electrical connections couples a non-active surface of the second electrical component to a second portion of the upper interconnect layer.

* * * * *